May 12, 1959 J. O. SCHROEDER 2,886,659
ZERO OUTPUT IMPEDANCE AMPLIFIER
Filed June 14, 1956
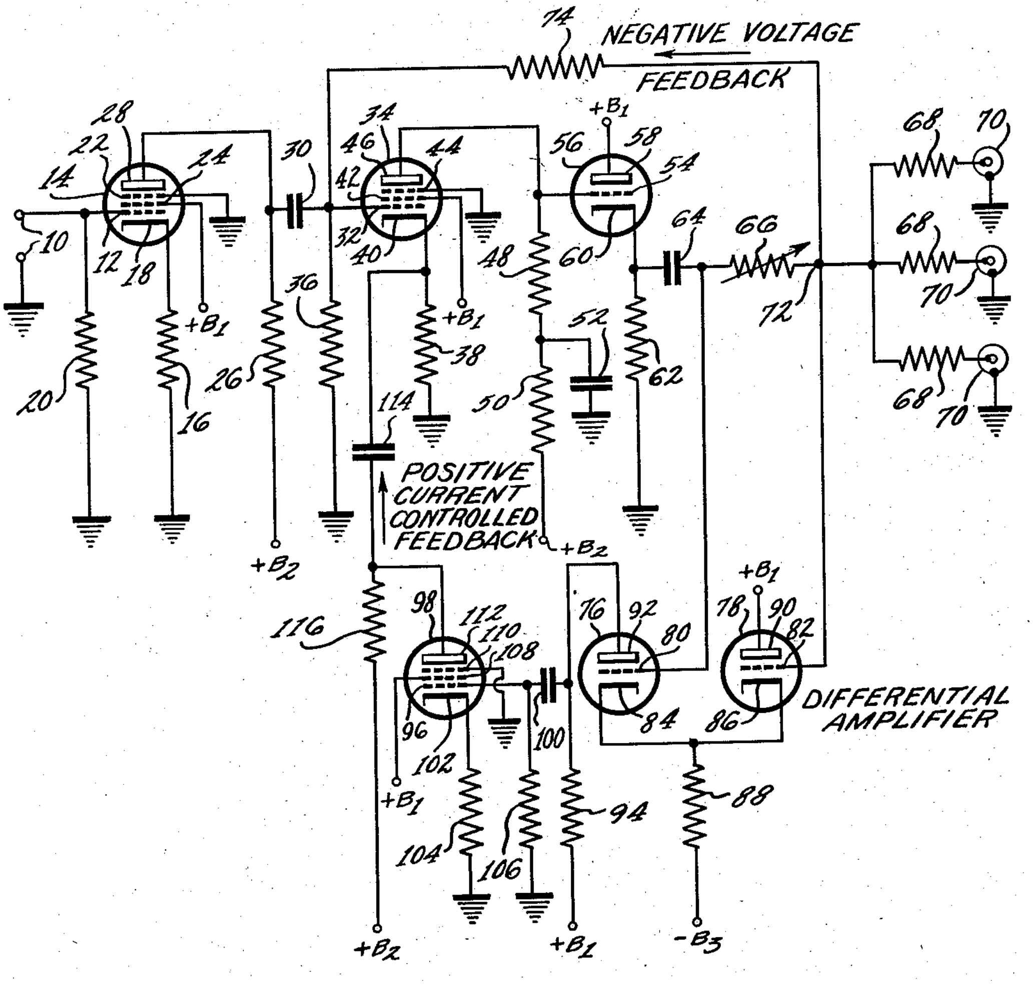
INVENTOR.
John O. Schroeder
BY
ATTORNEY United States Patent Office 2,886,659

Patented May 12, 1959

2,886,659

ZERO OUTPUT IMPEDANCE AMPLIFIER

John O. Schroeder, Clifton, N.J., assignor to Radio Corporation of America, a corporation of Delaware Application June 14, 1956, Serial No. 591,326

5 Claims. (Cl. 179—171)

This invention relates to signal amplifier circuits, and more particularly to signal amplifier circuits having an essentially zero output impedance.

The output impedance of a signal amplifier may be effectively reduced to a low value by the use of large amounts of negative voltage feedback. If a further reduction in the output impedance of the amplifier is required, a controlled amount of positive current feedback may be applied to reduce the output impedance of the amplifier to zero or even to some negative value. With proper design, reduction in the overall distortion of the amplifier may also be realized along with the reduction of the output impedance. A very low or zero output impedance may be important in many applications. For example, it may be required to amplify a wide band television signal and distribute it through coaxial transmission lines to several different types of equipment. If the amplifier has a zero output impedance, essentially complete isolation of the transmission lines may be obtained, preventing interaction between the various equipments fed by these lines.

It is an object of this invention to provide an improved signal amplifier circuit for wide band signals having an essentially zero output impedance.

However, wtih amplifiers as conventionally designed utilizing transformer couplings to amplify wide band signals, such as television signals, the proper relationship and amount of positive current feedback and negative voltage feedback may be difficult to obtain because of the phase shift and resonance problems that may be encountered with transformers.

It is, therefore, another object of this invention to provide an improved signal amplifier circuit for wide band signals utilizing positive current feedback and negative voltage feedback to secure an essentially zero output impedance for the amplifier without the use of transformers for isolation purposes.

It is also an object of the present invention to provide an improved signal amplifier circuit for television signals and the like adapted to feed several transmission lines and to secure substantially infinite isolation between lines, with negative and positive feedback means and without the use of transformer coupling in the amplifier.

In general, a wide band signal amplifier embodying the invention is provided with a negative voltage feedback circuit between the output and input circuits of the amplifier, and with means providing positive current feedback from the output circuit through a differential amplifier to the input circuit, the differential amplifier being coupled to the output circuit to provide an output signal proportional to the current in the output circuit.

The invention will be further understood when the following description is read in connection with the accompanying drawing, in which the sole figure is a schematic circuit diagram of a wide-band signal amplifier circuit illustrating an embodiment of the invention.

Referring now to the drawing, input signals to the amplifier are applied to a pair of signal input terminals 10, one of which is connected to ground for the amplifier and the other of which is connected to apply the input signals directly to the control grid 12 of a preamplifier electron tube 14. The preamplifier circuit includes a bias resistor 16 connected between the cathode 18 and ground. The suppressor grid 22 is grounded and the screen grid 24 is connected directly to a first source of positive operating voltage or screen grid potential, $+B_1$.

The signals are amplified in the preamplifier tube 14 and appear across a load resistor 26 which is connected between the anode 28 of the preamplifier tube 14 and a second source of operating voltage, $+B_2$. The amplified signals are applied through a coupling capacitor 30 from the anode 28 to the control grid 32 of a first amplifier tube 34. The control grid 32 is connected with ground through a grid resistor 36, and bias for the tube 34 is provided by a bias resistor 38 connected between the cathode 40 and ground. The screen grid 42 and the suppressor grid 44 are connected, respectively, to the first source of operating potential, $+B_1$, and ground. Signals from the anode 46 of the first amplifier tube 34 are developed across a signal load resistor 48 which has one terminal connected to the anode 46 and the other terminal connected to the second source of operating voltage, $+B_2$, through a decoupling resistor 50. The decoupling resistor 50 together with a bypass capacitor 52, connected between signal ground and the junction of the decoupling resistor 52 and the load resistor 48, provide a filter to prevent signal voltages from appearing in the various power supplies.

The signals developed across the load resistor 48 are coupled directly to the control grid 54 of a triode output amplifier tube 56. The triode 56 is connected as a common-plate amplifier and has its anode 58 connected directly to the second source of operating potential, $+B_2$, and its cathode 60 connected to ground through a cathode load resistor 62. The signals thus appear at the cathode 60 across the load resistor 62, and are conveyed through a coupling capacitor 64 and a current feedback resistor 66, the action of which will be more fully explained hereinafter, and impedance matching resistors 68, to a trio of coaxial connectors 70. Signals may thus be conveyed from the connectors through coaxial transmission lines to other equipment or utilization devices (not shown).

Negative voltage feedback is provided by connecting the circuit junction point 72, which is the common junction point of the current feedback resistor 66 and the matching resistors 68 in the output circuit, through a voltage feedback resistor 74 to the control grid 32 of the first amplifier tube 34. The addition of the negative voltage feedback connection provides, among other things, a reduction in the output impedance of the amplifier, as is well known.

In accordance with the invention, positive current feedback is provided for the amplifier through a circuit including a differential amplifier comprising a pair of triode amplifier tubes 76 and 78. The control grid 80 of the first differential amplifier tube 76 is connected to the amplifier output circuit at the junction of the coupling capacitor 64 and current feedback resistor 66, that is, to the signal input end of the resistor 66. The control grid 82 of the second differential amplifier tube 78 is connected to the output circuit at the junction point 72 which is at the signal output end of the resistor 66. Operating potential for the differential amplifier tubes 76 and 78 is supplied by coupling the cathodes 84 and 86 to a third source of operating potential, $-B_3$, negative with respect to ground, through a common cathode or coupling resistor 88; by connecting the anode 90 of the second differential amplifier tube 78 directly to the first source of operating potential, $+B_1$; and by connecting the anode 92 of the first differential amplifier tube 76 to the first source of operating potential, $+B_1$, through a load resistor 94.

Due to the action of the differential amplifier which will be more fully explained hereinafter, a positive current feedback signal appears at the anode 92 of the first differential amplifier 76 and is applied to the control grid 96 of an isolating amplifier tube 98 through a coupling capacitor 100. Bias is provided for the isolating amplifier tube 98 by connecting the cathode 102 to ground through a cathode resistor 104, and a grid return resistor 106 is connected between the control grid 96 and ground. The screen grid 108 of the isolating tube 98 is connected to the first source of operating potential, $+B_1$, and the suppressor grid 110 is connected directly to ground. Operating potential for the isloating tube 98 is provided by connecting the anode 112 to the second source of operating potential, $+B_2$, through a load resistor 116. The positive current feedback signal will thus be seen to appear at the anode 112 of the isolating tube 98 and is applied to the cathod 40 of the first amplifier tube 34 through a coupling capacitor 114.

The operation of the amplifier together with the negative feedback circuit is well known and is not separately described but will be referred to in connection with the description of the positive feedback circuit.

In order to describe the action of the positive feedback circuit, assume that a positive-going signal is present at the control grid 32 of the first amplifier tube 34. This positive signal will produce a negative-going signal at the cathode 60 of the output tube 56. The negative-going signal will make the left hand side of the current feedback resistor 66 more negative. The amount of current flowing in resistor 66 will be indicated by the difference in potential between its ends. Thus, in the example given, the control grid 80 of the first differential amplifier tube 76 will be made more negative and the control grid 82 of the second differential amplifier tube 78 will be made more positive. The second differential amplifier tube 78 will thus conduct more heavily, causing an increase in current flow through the coupling resistor 88 which will increase the positive potential of the cathodes 84 and 86. If the cathode 84 of the first differential amplifier tube 76 is made more positive as its grid 80 is being made more negative, a reduction of current flow through the tube will result. This action will cause an increase in the voltage at the anode 92 of the first differential amplifier tube 76. The increase in voltage is applied to the control grid 96 of the isolating tube 98 and appears as a negative going-signal at the anode 112. The negative-going signal at the anode 112 is applied through the coupling capacitor 114 to the cathode 40 of the first amplifier tube 34.

It will thus be seen that a positive going-signal on the grid 32 of the first amplifier tube 34 will result in a negative signal from the positive feedback loop on the cathode 40 of the first amplifier tube 34, and will, of course, be regenerative or positive current controlled feedback.

The current feedback resistor 66 thus produces a sample of the current in the output circuit of the signal amplifier. This sample of output current is converted to a pair of voltages which are applied to the differential amplifier. For proper operation, the differential amplifier should produce a zero output signal when both of the control grids 80 and 82 of the differential amplifier tubes 76 and 78 are driven by the same input signal, that is, when no current is flowing in the load circuit. This condition very nearly exists if the cathode coupling resistor 88 is very large.

It will be noted that this arrangement eliminates an isolation transformer or output transformer to isolate the amplifier output circuit from ground so that a portion or sample of the output current may be obtained. The presence of an output or isolating transformer may limit the useful band width of the amplifier because of phase shift problems. Possible resonances of the transformer would also produce other problems that are avoided by this circuit. Thus, in accordance with the invention, a positive feedback current is provided while one side of the amplifier output circuit is maintained at true ground potential.

Although the various values of the positive and negative feedback ratios for any specific amplifier design must be calculated or determined experimentally, the procedure for determining the condition of zero output impedance may be the same in all cases. First, with the current feedback resistor 66 set at zero, sufficient negative feedback voltage is applied by selecting the value of the negative feedback voltage resistor 74 to produce an effective output impedance at the point 72 on the order of 5 ohms. With currently available high transconductance tubes this can be accomplished with a feedback ratio of about 0.5. The output impedance may be determined by shorting the input terminals 10 to the preamplifier and applying a signal voltage into one of three output connectors 70. The voltage at one of the other two output conenctors 70 is then measured by a sensitive electronic volt-meter. The positive feedback ratio is set by varying the current feedback resistor 66. With the volt-meter connected, the resistance of the current feedback resistor 66 is gradually increased until such time as the volt-meter reads zero or a minimum deflection, indicating infinite or maximum isolation between the output connectors 70.

If the value of the current feedback resistor 66 is increased further, a negative output impedance for the signal amplifier will be produced. However, to provide maximum isolation between coaxial transmission lines which may be connected to the connectors 70 such a negative resistance would have no real value, since less than infinite isolation would be produced by a negative output impedance.

A signal amplifier circuit utlizing positive and negative feedback in accordance with the invention produces essentially a zero output impedance without the use of transformers which may limit the useful band width of the amplifier, and the invention may find wide application where isolation is required between various equipments that may be driven by a single signal amplifier.

What is claimed is:

1. In a signal amplifier having an input circuit and an output circuit, the combination comprising, a negative voltage feedback circuit connected between the input and the output circuits of said signal amplifier, means connected in said output circuit for developing control voltages representative of the signal current flowing in the output circuit, differential amplifier means, means for applying said control voltages to said differential amplifier means, means for deriving an output voltage from said differential amplifier means corresponding to the difference between said control voltages, and means for applying the output voltage of said differential amplifier means to the input circuit of said signal amplifier to provide a regenerative feedback voltage therefor.

2. In a signal amplifier having an input and an output circuit, the combination comprising, means providing a negative voltage feedback conection between the output and the input circuits of said signal amplifier, means connected in said output circuit for developing control signals proportional to the signal current flowing therein, differential amplifier means, means for applying said control signals to said differential amplifier means for deriving an output signal therefrom responsive to said control signals, and means connected for applying the output signal voltage of said differential amplifier means to the input circuit of said signal amplifier to provide regenerative feedback for said signal amplifier proportional to the signal current in said output circuit, said means for developing control signals being adjustable whereby the output impedance of said signal amplifier may be reduced to zero.

3. A signal amplifier circuit having an output impedance capable of being adjusted to zero comprising in combination, means providing a plurality of cascaded amplifier stages, means providing an input circuit connected to the first of said amplifier stages, means providing an output circuit connected to the last of said amplifier stages, negative voltage feedback means connected between said output and said input circuits for reducing the output impedance of said amplifier, means connected in said output circuit for developing a pair of control voltages representative of the signal current flowing therein, a differential amplifier circuit connected to be driven by said pair of control voltages and to provide an output voltage proportional to said control voltages, means for applying the output voltage of said differential amplifier circuit in regenerative phase to the input circuit of said signal amplifier, and means for controlling the relative values of said control voltages to reduce the output impedance of said amplifier to zero.

4. A signal amplifier circuit adapted to have an output impedance capable of being adjusted to zero comprising in combination, a plurality of voltage amplifier stages, each amplifier stage including an electron tube having at least an anode, a cathode, and a control grid, signal input circuit means for applying an input signal voltage between the control grid and the cathode of the first stage electron tube, signal output circuit means for deriving an output signal from the last stage electron tube, a negative voltage feedback circuit connected between said last stage and the control grid of said first stage electron tube for reducing the output impedance of said amplifier to a low value, means providing a differential amplifier including a pair of electron tubes each having a cathode, an anode, and a control grid, means including a resistor serially connected with said signal output circuit means for deriving a pair of control signal voltages proportional to the output signal current flowing in said output circuit means, means for applying said control signal voltages to the control grids of the electron tubes of the differential amplifier, means for deriving an output signal from the differential amplifier, means for applying said differential amplifier output signal to the cathode of the first stage electron tube in a regenerative feedback connection, and means to vary the value of said resistor to vary the regenerative feedback thereby to reduce the output impedance of said signal amplifier to zero.

5. A signal amplifier circuit adapted to have the output impedance thereof adjusted to zero comprising in combination, a plurality of cascaded signal amplifier stages, each of said stages including an electron tube having at least an anode, a cathode, and a control grid, a signal input circuit connected between the control grid and the cathode of a first stage electron tube, a signal output circuit connected between the cathode of the last stage electron tube and signal reference potential ground for said amplifier, a negative feedback circuit connected between the cathode of said last stage electron tube and the control grid of said first stage electron tube for reducing the output impedance of said amplifier, a pair of differential amplifier electron tubes each having a cathode, an anode, and a control grid, means for coupling the cathodes of said electron tubes to signal ground through a common impedance element, a current feedback resistor serially connected in said signal output circuit for deriving a pair of output voltages proportional to current-flowing in said signal output circuit, means connecting one end of said resistor to the control grid of the first of said pair of differential amplifier electron tubes, means connecting the other end of said resistor to the control grid of the other of said differential amplifier electron tubes, means including a resistor connected in series with the anode of one of said differential amplifier electron tubes for deriving an output feedback signal therefrom, means for applying said output feedback signal in a regenerative feedback phase to the cathode of said first stage electron tube, and means for varying the value of said current feedback resistor to vary the regenerative feedback and reduce the output impedance of said signal amplifier to zero.

References Cited in the file of this patent

UNITED STATES PATENTS

| | | |
|---|---|---|
| 2,173,427 | Scott | Sept. 19, 1939 |
| 2,475,258 | Scott | July 5, 1949 |
| 2,586,167 | Kamm | Feb. 19, 1952 |